(12) United States Patent
Kawamura et al.

(10) Patent No.: US 10,821,584 B2
(45) Date of Patent: Nov. 3, 2020

(54) COMPONENT DETACHMENT JIG

(71) Applicant: Yazaki Corporation, Tokyo (JP)

(72) Inventors: Yukihiro Kawamura, Shizuoka (JP); Hiroaki Yamada, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 493 days.

(21) Appl. No.: 15/016,786

(22) Filed: Feb. 5, 2016

(65) Prior Publication Data

US 2016/0151898 A1 Jun. 2, 2016

Related U.S. Application Data

(63) Continuation of application No. PCT/JP2014/072388, filed on Aug. 27, 2014.

(30) Foreign Application Priority Data

Sep. 9, 2013 (JP) .................................. 2013-186181

(51) Int. Cl.
*B25B 27/14* (2006.01)
*B25B 9/02* (2006.01)
(Continued)

(52) U.S. Cl.
CPC ............... *B25B 27/14* (2013.01); *B25B 9/02* (2013.01); *H01H 85/0208* (2013.01); *H05K 13/0491* (2013.01)

(58) Field of Classification Search
CPC . H01H 85/0208; H05K 13/0491; B25B 27/14
(Continued)

(56) References Cited

U.S. PATENT DOCUMENTS 2,829,917 A * 4/1958 Wiora ................. H01M 2/1005
  294/90
3,317,989 A * 5/1967 Cull ....................... H01R 43/26
  29/747
(Continued)

FOREIGN PATENT DOCUMENTS

JP        57-86761 U    5/1982
JP        57-113497 U   7/1982
(Continued)

OTHER PUBLICATIONS

Communication dated Oct. 3, 2017 from the Japanese Patent Office in counterpart Japanese application No. 2013-186181.
(Continued)

*Primary Examiner* — Orlando E Aviles
*Assistant Examiner* — Seahee Hong
(74) *Attorney, Agent, or Firm* — Sughrue Mion, PLLC

(57) ABSTRACT

A relay detachment jig includes a handle, a pair of holders that holds a relay, a hold releasing unit that connects the handle and the pair of holders and that is elastically deformable, a deformation restricting unit that restricts elastic deformation of the hold releasing unit, an engagement releasing unit that releases the engagement between the relay and a housing member, and a movement restricting unit that restricts a movement of the relay held in the relay detachment jig in a detaching direction. The handle is provided in a manner extending in the detaching direction from the hold releasing unit.

10 Claims, 8 Drawing Sheets

(51) Int. Cl.
*H01H 85/02* (2006.01)
*H05K 13/04* (2006.01)

(58) Field of Classification Search
USPC ............... 29/278, 740, 741, 764; 294/99.2
See application file for complete search history.

(56) References Cited

U.S. PATENT DOCUMENTS

| | | | |
|---|---|---|---|
| 3,628,824 A | 12/1971 | Leuw et al. | |
| 3,632,973 A * | 1/1972 | O'Keefe | B23K 3/047 219/230 |
| 3,842,478 A * | 10/1974 | Schreckeneder | B23K 1/018 228/20.5 |
| 3,974,556 A * | 8/1976 | Kubik | H05K 13/0491 29/764 |
| 4,141,138 A * | 2/1979 | Quick | H05K 13/0417 29/740 |
| 4,226,459 A | 10/1980 | Natalicio | |
| 4,475,283 A * | 10/1984 | Olson | B25B 9/02 29/278 |
| 4,660,281 A * | 4/1987 | Omand | H05K 13/0491 29/758 |
| 4,666,199 A * | 5/1987 | Cheh | H05K 13/0491 294/106 |
| 4,827,607 A | 5/1989 | Korsunsky et al. | |
| 4,873,761 A * | 10/1989 | Korsunsky | H05K 13/0491 29/268 |
| 4,941,700 A * | 7/1990 | Lin | H05K 13/0491 29/740 |
| D340,173 S * | 10/1993 | Feng | D28/55 |
| 5,479,669 A * | 1/1996 | Chen | H05K 13/0092 29/758 |
| 5,549,240 A * | 8/1996 | Urban | B23K 1/018 228/264 |
| 5,566,445 A * | 10/1996 | Piao | H05K 13/0447 29/741 |
| 5,875,544 A * | 3/1999 | Chou | B25G 1/10 29/741 |
| 5,926,948 A * | 7/1999 | Pong | H01R 43/26 29/758 |
| 6,202,295 B1 * | 3/2001 | Easter | H01R 43/205 29/762 |
| 6,779,256 B2 * | 8/2004 | Kappel | B25B 27/02 29/278 |
| 6,871,567 B2 | 3/2005 | Piñana Lopez | |
| 7,017,259 B2 * | 3/2006 | Aoki | H01R 12/585 29/739 |
| 7,384,086 B2 | 6/2008 | Lukaszynski et al. | |
| 8,425,249 B2 * | 4/2013 | Hackett | H01R 13/443 439/357 |
| 8,425,429 B2 * | 4/2013 | Tommerdahl | A61H 23/00 600/552 |
| 2005/0120530 A1 * | 6/2005 | Persson | B23B 51/14 29/270 |
| 2005/0257369 A1 * | 11/2005 | Daily | H05K 13/0491 29/832 |
| 2006/0035495 A1 | 2/2006 | Iwata et al. | |
| 2011/0148129 A1 | 6/2011 | Wang | |
| 2013/0230993 A1 | 9/2013 | Hackett et al. | |

FOREIGN PATENT DOCUMENTS

| | | |
|---|---|---|
| JP | 58-95049 U | 6/1983 |
| JP | 63-47073 A | 2/1988 |
| JP | 64-41198 U | 3/1989 |
| JP | 2-262970 A | 10/1990 |
| JP | 7-22796 A | 1/1995 |
| JP | 7-302537 A | 11/1995 |
| JP | 9-123069 A | 5/1997 |
| JP | 2004-281078 A | 10/2004 |

OTHER PUBLICATIONS

Communication dated May 16, 2017 issued by the Japanese Patent Office in counterpart application No. 2013-186181.
International Search Report for PCT/JP2014/072388 dated Nov. 18, 2014.
Communication dated May 21, 2019, issued by the German Patent Office in counterpart German Application No. 11 2014 004 121.1.

* cited by examiner

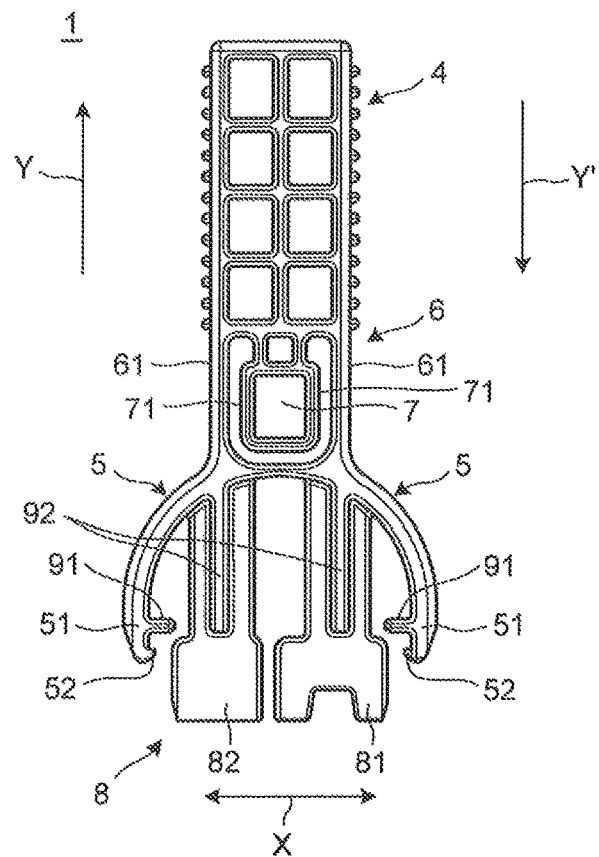
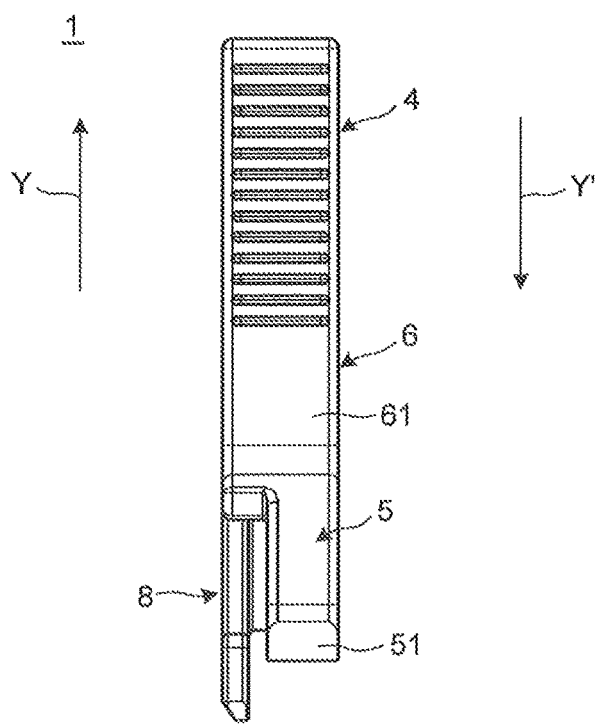

COMPONENT DETACHMENT JIG

CROSS-REFERENCE TO RELATED APPLICATION

This application is a continuation application of International Application PCT/JP2014/072388, filed on Aug. 27, 2014, and designating the U.S., the entire contents of which are incorporated herein by reference.

BACKGROUND OF THE INVENTION

1. Field of the Invention

The present invention relates to a component detachment jig for detaching a component from a housing to which the component is attached.

2. Description of the Related Art

Conventionally disclosed are various types of component detachment jigs for detaching a component from a frame of an electrical junction box or the like to which the component is attached without damaging the component, because the detached component may become damaged if the component is detached from the frame by gouging the component with a tool such as a needle-nose pliers (see Japanese Patent Application Laid-open No. 2004-281078, for example).

For example, according to the disclosure of Japanese Patent Application Laid-open No. 2004-281078, a fuse is detached from a housing by using a component detachment jig including two legs extending from respective sides, and engaging hooks that are provided on the respective legs and become engaged with the fuse, and by engaging the engaging hooks onto the fuse attached on the housing, and pulling out the fuse.

However, the conventional component detachment jig disclosed in Japanese Patent Application Laid-open No. 2004-281078 has inferior workability because not much consideration is given to how the component is detached from the component detachment jig after the component is detached from the housing, and the two legs of the detachment jig need to be separated from each other by holding the legs by hands and releasing the fuse held between the legs, for example.

SUMMARY OF THE INVENTION

It is an object of the present invention is to provide a component detachment jig with better workability with a focus on such shortcomings.

In order to achieve the above mentioned object, a component detachment jig according to the one aspect of the present invention is for removing a component from a housing to which the component is attached. The component detachment jig includes a handle; a pair of holders configured to hold the component; and a hold releasing unit configured to connect the handle and the pair of holders, and to be elastically deformable in a direction intersecting with a detaching direction in which the component is detached. Herein, the handle is provided in a manner extending in the detaching direction from the hold releasing unit. Each holder in the pair of holders has a cantilever-arm like shape which is bendable and deformable, and has one end which is not connected to the hold releasing unit provided with a protrusion protruding in a direction toward a protrusion on the other holder, and supporting the component in a direction opposite to the detaching direction. The pair of holders is enabled to bend and deform in a direction moving away from each other when the hold releasing unit is elastically deformed, and when the protrusions are pressed from a side opposite to the handle in the detaching direction.

According to another aspect of the present invention, the component detachment jig further includes a deformation restricting unit configured to restrict elastic deformation of the hold releasing unit.

According to still another aspect of the present invention, in the component detachment jig, the hold releasing unit is configured as two bendable and deformable plates, and the plates are enabled to abut against the deformation restricting unit.

According to still another aspect of the present invention, in the component detachment jig, the component is a component having an engaging unit which is to be engaged with the housing. The component detachment jig further includes an engagement releasing means configured to release an engagement between the housing and the component engaged with the housing.

According to still another aspect of the present invention, the component detachment jig further includes a movement restricting unit configured to restrict a movement of the component supported by the protrusions in the detaching direction.

According to still another aspect of the present invention, in the component detachment jig, the handle has a width smaller than an external size of the pair of holders in a direction in which the pair of holders facing each other.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2A is a front view of the relay detachment jig illustrated in FIG. 1;

FIG. 2B is a side view of the relay detachment jig illustrated in FIG. 1;

DETAILED DESCRIPTION OF THE PREFERRED EMBODIMENTS

Figure 3:
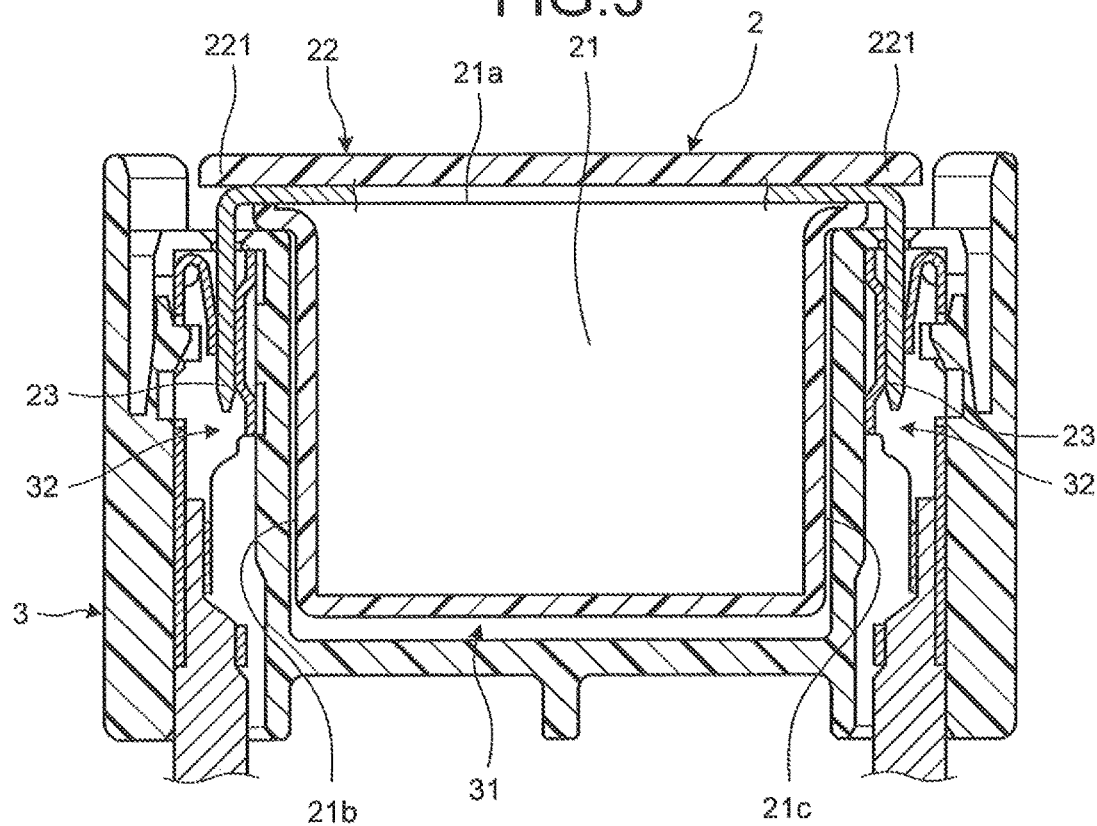
FIG. 3 is a cross-sectional view illustrating a relay and a housing member for which the relay detachment jig illustrated in FIG. 1 is used.
Figure 6:
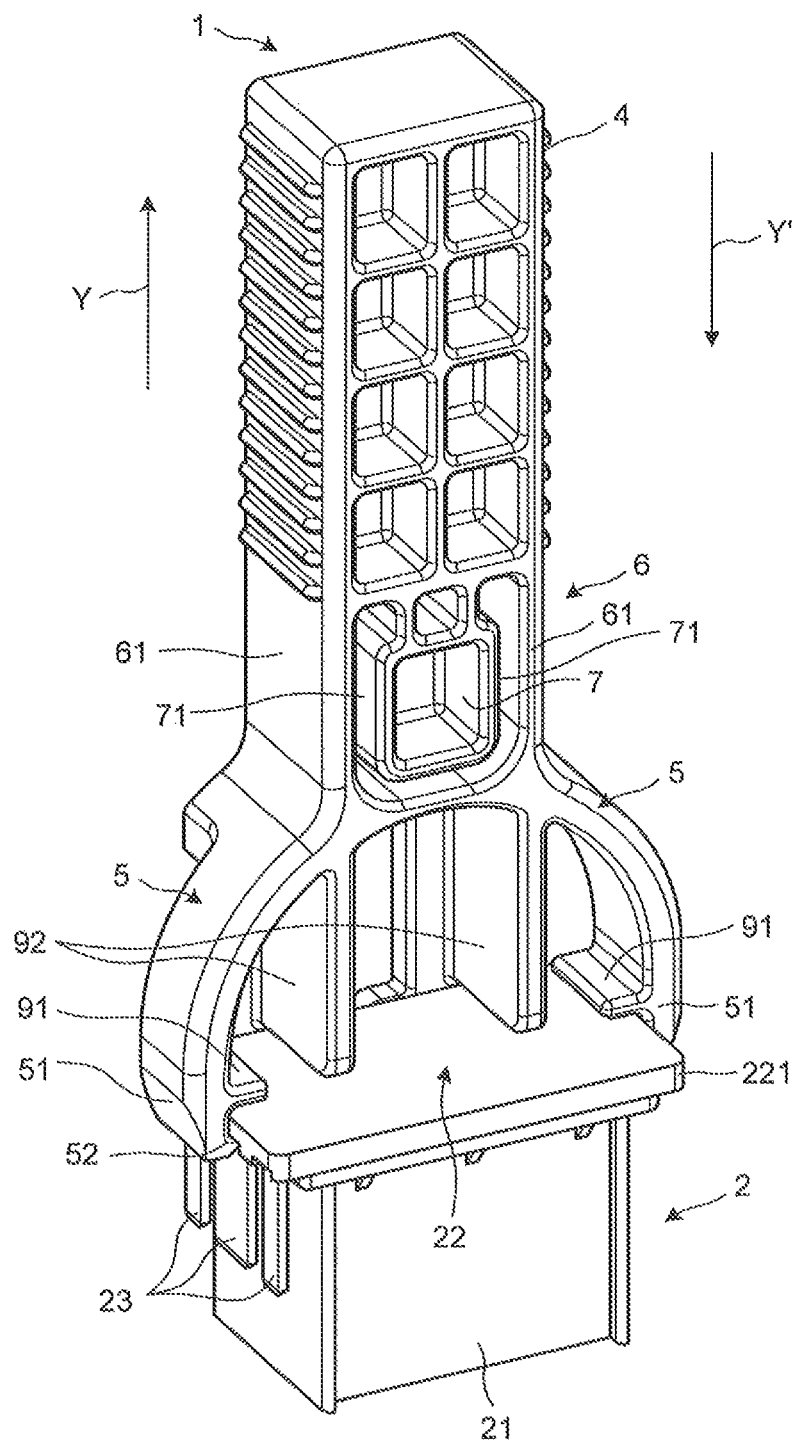
FIG. 6 is a perspective view of the relay detachment jig illustrated in FIG. 1 holding the relay.
Figure 7:
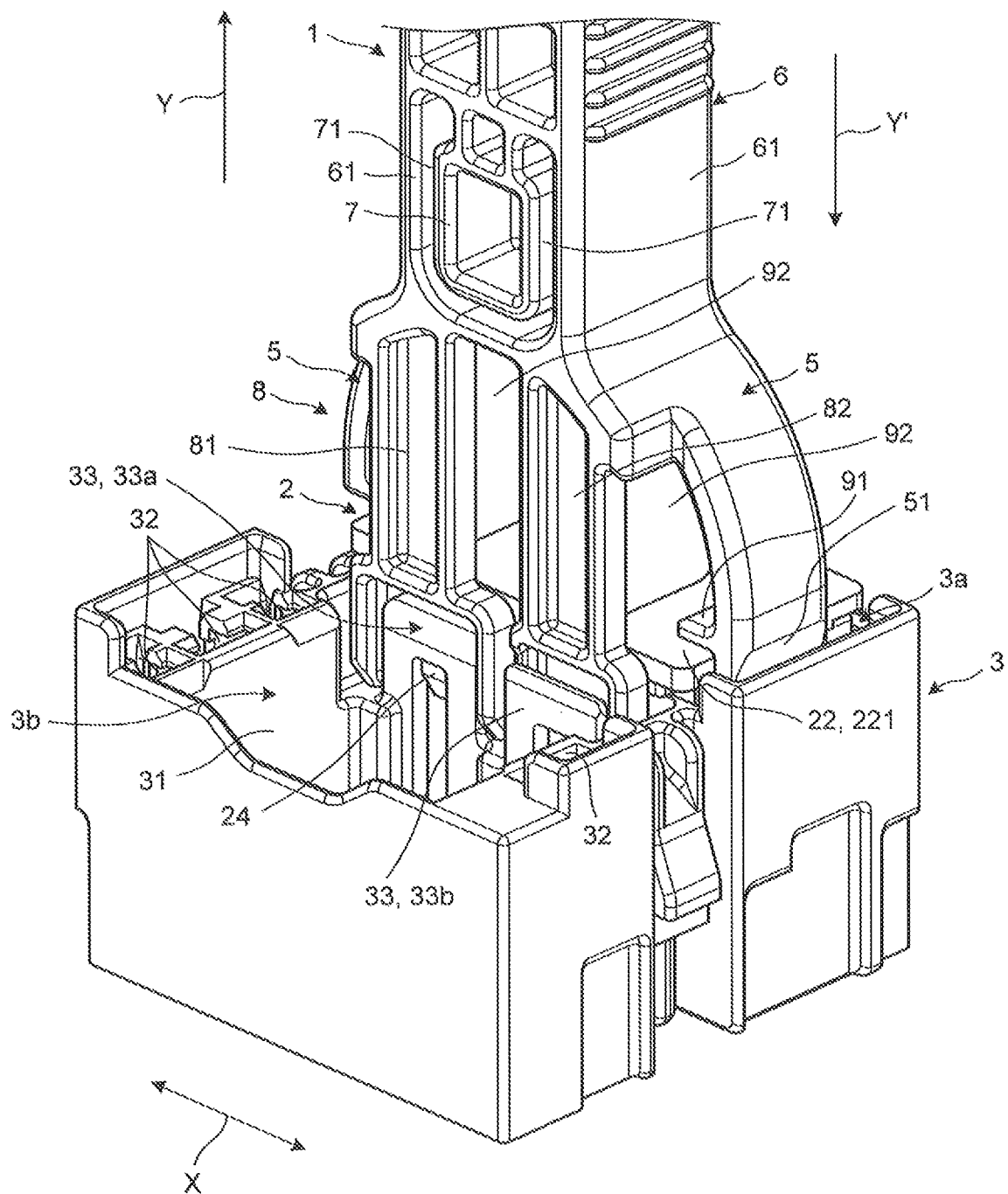
FIG. 7 is a perspective view of the relay detachment jig illustrated in FIG. 1 holding the relay, with the engagement between the housing member and the relay released.

One embodiment of the present invention will now be explained with reference to FIGS. 1 to 9. In this embodiment, a relay detachment jig 1 (which corresponds to a "component detachment jig" in the appended claims) handling a relay as a component to be detached is used as a jig for detaching a relay 2 illustrated in FIG. 3 (which corresponds to a "component" in the appended claims, and which is a patent-pending but not known relay by the applicant of this application) from a housing member 3 (which corresponds to a "housing" in the appended claims) attached to the frame of an electrical junction box not illustrated, for example. In this embodiment, as illustrated in FIGS. 3 and 7, the relay 2 is attached to the housing member 3. In this embodiment, the direction indicated by the arrow X in the drawings will be referred to as a width direction X of the relay detachment jig 1. The direction indicated by the arrow Y in the drawings will be referred to as the detaching direction Y of the relay detachment jig 1, and the direction indicated by the arrow Y' extending oppositely to the detaching direction Y will be referred to as a pressing direction Y' of the relay detachment jig 1. The top and the bottom with respect to the detaching direction Y are defined with reference to the top and the bottom in the paper surface direction in FIG. 1. The width direction X intersects with, more preferably, intersects perpendicularly with the detaching direction Y and the pressing direction Y'.

Figure 1:
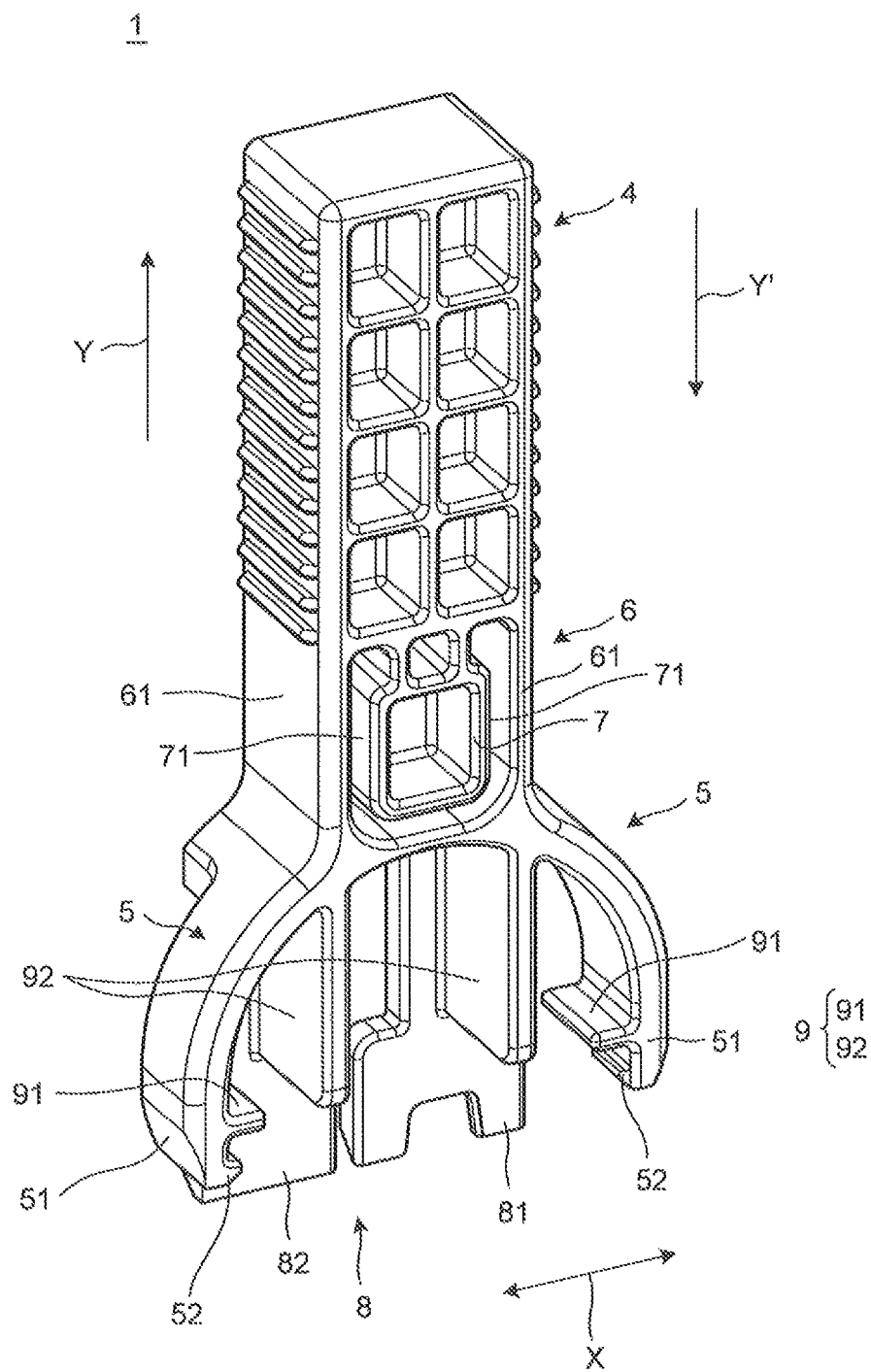
FIG. 1 is a perspective view illustrating a relay detachment jig according to one embodiment of the present invention.

The relay detachment jig 1 is made of synthetic resin, and includes, as illustrated in FIGS. 1, 2A, and 2B, a handle 4, a pair of holders 5 that holds the relay 2, a hold releasing unit 6 that connects the handle 4 and the pair of holders 5 and is elastically deformable in the width direction X, a deformation restricting unit 7 for restricting the elastic deformation of the hold releasing unit 6, an engagement releasing unit 8 that releases the engagement between the housing member 3 and the relay 2, and a movement restricting unit 9 that restricts the movement of the relay 2 held by the relay detachment jig 1 in the detaching direction Y. The pair of holders 5 is arranged facing the other in the width direction X, as illustrated in FIGS. 1 and 2A. In other words, the pair of holders 5 faces each other in, and the hold releasing unit 6 elastically deforms in the width direction X. The handle 4, the hold releasing unit 6, and the holders 5 are connected to one another sequentially in the order described herein in the pressing direction Y' of the relay detachment jig 1. In other words, while the relay 2 is held in the relay detachment jig 1, as illustrated in FIG. 6, the pair of holders 5 is positioned nearest to the relay 2, the handle 4 is positioned farthest from the relay 2, and the hold releasing unit 6 is positioned between the pair of holders 5 and the handle 4, along the detaching direction Y or the pressing direction Y'.

The handle 4 is provided in a manner extending in the detaching direction Y from the hold releasing unit 6, and has a size smaller than the outer size of the pair of holders 5 in the width direction X. In other words, the "outer size of the pair of holders 5" can also be said to be the length between the two external edges of the pair of holders 5 in the width direction X. The length of the handle 4 in the width direction X is smaller than the "outer size of the pair of holders 5", as illustrated in FIGS. 1 and 2A.

The pair of holders 5 extends from the hold releasing unit 6 toward the side opposite to the handle 4, extends in the direction moving away from each other, and has a cantilever-arm-like shape that is bendable and deformable. Ends 51 of respective holders 5, the ends being those not connected to the hold releasing unit 6, are provided with hook-like protrusions 52, respectively, extending in the direction X and in a direction toward the protrusion on the other holder 5, and supports the relay 2 upwardly in the detaching direction Y. The ends 51 of the pair of respective holders 5 are also bendable and deformable in the direction moving away from each other and in an upward direction when the protrusions 52 are pressed.

The hold releasing unit 6 has a pair of hold releasing unit main bodies 61 that extend in parallel with the detaching direction Y, and each of which is a plate-like member that is bendable and deformable in the width direction X. The pair of holders 5 is provided in such a manner that the ends 51 are bent and deformed in the direction moving away from each other and in the upward direction when the pair of hold releasing unit main bodies 61 is bent and deformed in the direction approaching each other. The pair of hold releasing unit main bodies 61 is also enabled to abut against respective restricting sides 71 of the deformation restricting unit 7 which will be described later.

The deformation restricting unit 7 restricts the extent to which the pair of hold releasing unit main bodies 61 is permitted to deform so that the pair of hold releasing unit main bodies 61 is prevented from being excessively deformed and becoming plastically deformed. The deformation restricting unit 7 has the pair of restricting side 71 provided in a substantially rectangular shape in a manner connected with the handle 4 and between the pair of hold releasing unit main bodies 61, and extending in parallel with the detaching direction Y.

The engagement releasing unit 8 (which corresponds to an "engagement releasing unit" in the appended claims) includes an engagement releasing piece 81 that is to be inserted between the relay 2 and the housing member 3 to release the engagement between the housing member 3 and the relay 2, and an aligning piece 82 that guides the position where the relay detachment jig 1 is inserted. The engagement releasing piece 81 and the aligning piece 82 are provided side by side along the width direction X. The engagement releasing piece 81 is provided with a two-pronged shape, the bottom end of which is configured to abut against an engaging protrusion 24 provided on the relay 2 which will be described later.

The movement restricting unit 9 includes a pair of first movement restricting units 91 each of which is provided connected to the corresponding end 51, and a pair of second movement restricting units 92 each of which extends downwardly from a middle of the corresponding holder in the pair of holders 5. Each of the first movement restricting units 91 is provided above the corresponding protrusion 52, and protrudes further toward the internal than the distance by which the protrusion 52 extends. One of the second movement restricting units 92 is connected to the engagement releasing piece 81, and the other is connected to the aligning piece 82. The protrusions 52, the first movement restricting units 91, and the second movement restricting units 92 are provided at the distances corresponding to the thickness of a plate-like member 22 provided to the relay 2, which is to be described later, in the detaching direction Y, and align the outer edges 221 of the plate-like member 22 between the protrusions 52. The first movement restricting units 91 and the second movement restricting units 92 are positioned above the plate-like member 22 provided to the relay 2, which will be described later, while the protrusions 52 support the relay 2, so that a movement of the relay 2 in the detaching direction Y is restricted.

Figure 4:
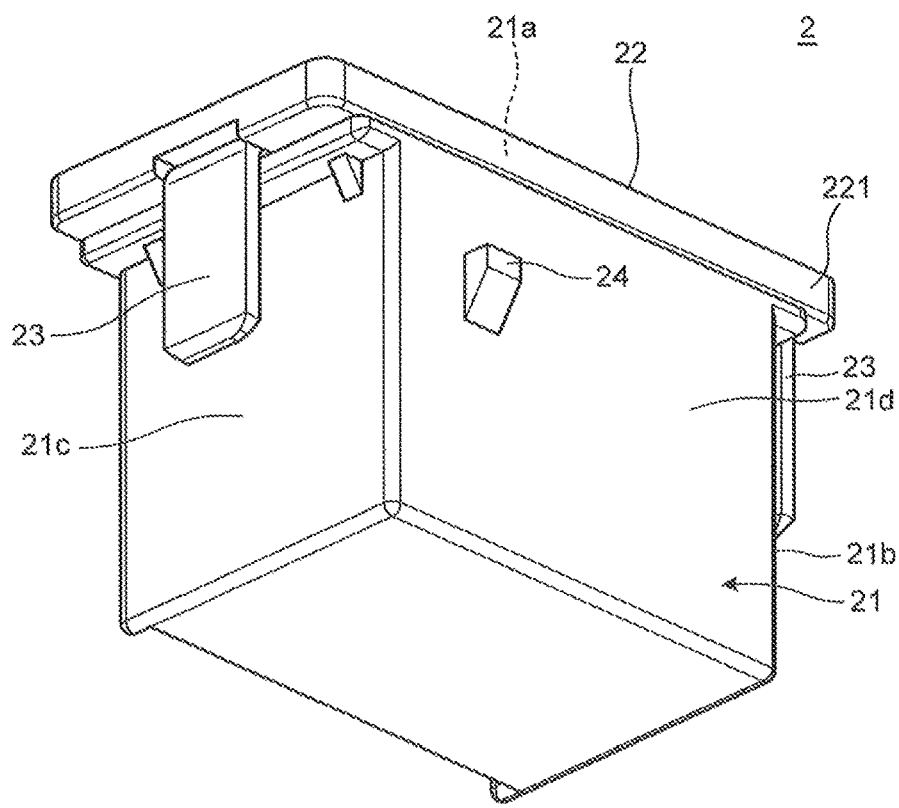
FIG. 4 is a perspective view of the relay illustrated in FIG. 3.

The relay 2 includes, as illustrated in FIGS. 3 and 4, a relay body 21 having a cuboid external shape, a plate-like member 22 that is fixed to a top surface 21a of the relay body 21, four terminals 23 that are supported by the plate-like member 22, that extend downwardly from the plate-like member 22, and that face a side surfaces 21b, 21c of the relay body 21, and an engaging protrusion 24 (which corresponds to an "engaging unit" in the appended claims) provided to a side surface 21*d* of the relay body 21. The outer edge 221 of the plate-like member 22 protrudes from the relay body 21 further toward the external. Various components housed inside of the relay body 21 are not illustrated in FIG. 3.

Figure 5:
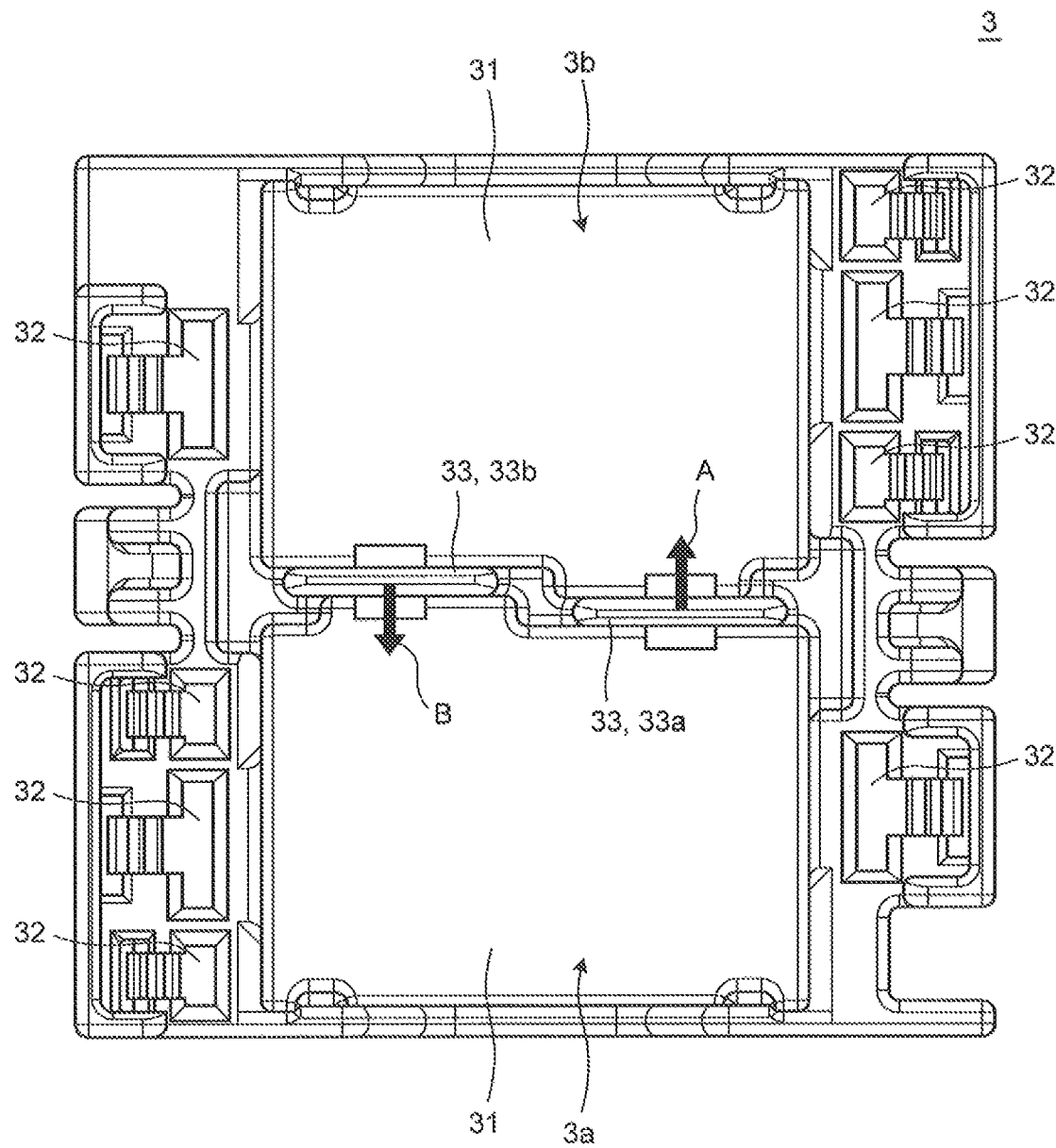
FIG. 5 is a plan view of the housing member illustrated in FIG. 3.

The housing member 3 is provided with two relay housings 3*a* and 3*b*, as illustrated in FIG. 5. Each of the housings 3*a* and 3*b* includes a relay body housing 31 for housing the relay body 21, terminal housings 32 each of which houses the corresponding terminal 23, and a deformable engaging piece 33 with which the engaging protrusion 24 is engaged.

The two relay housings 3*a* and 3*b* are positioned point-symmetrically, as illustrated in FIG. 5, and the two relay body housings 31 are partitioned by the two engaging pieces 33. The two engaging pieces 33 are positioned along the border between the two relay housings 3*a* and 3*b*, and provided offset from each other in the direction in which the two relay housings 3*a* and 3*b* are arranged, and also in a direction perpendicular to the direction in which the two relay housings 3*a* and 3*b* are arranged. The relay 2 housed in the relay housing 3*a* has the engaging protrusion 24 engaged with a engaging piece 33*a*, and the relay 2 housed in the relay housing 3*b* has the engaging protrusion 24 engaged with a engaging piece 33*b*. The engaging pieces 33*a* and 33*b* are deformable in both of the directions indicated by the arrows A and B illustrated in FIG. 5. By causing the engaging pieces 33*a* and 33*b* to deform, the engagement between the relay housings 3*a*, 3*b* and the respective relays 2 housed in the respective relay housings 3*a* and 3*b* is released.

A way in which the relay 2 housed in the relay housing 3*a* is detached with the relay detachment jig 1 will now be explained with reference to FIGS. 6 to 9. To begin with, an operator holding the handle 4 makes a pressing operation of pressing the relay detachment jig 1 against the top surface of the plate-like member 22 of the relay 2 in the pressing direction Y'. This pressing operation causes the protrusions 52 to abut against the plate-like member 22, to be pressed in the detaching direction Y, and to bend and deform in the direction in which the pair of holders 5 moves away from each other and in the upward direction. As the pair of holders 5 becomes bent and deformed, the ends 51 of the pair of holders 5 become separated by a distance wider than the length between the outer edges 221 of the plate-like member 22, thereby releasing the pressing force against the protrusions 52. This releasing of force brings the pair of holders 5 back to the original position where no force is applied, and the outer edge 221 becomes supported upwardly by the protrusions 52, as illustrated in FIGS. 6 and 9. In this manner, the relay 2 is held in the relay detachment jig 1. While the relay 2 is held in the relay detachment jig 1, the first movement restricting unit 91 and the second movement restricting unit 92 are positioned above the plate-like member 22.

Figure 8:
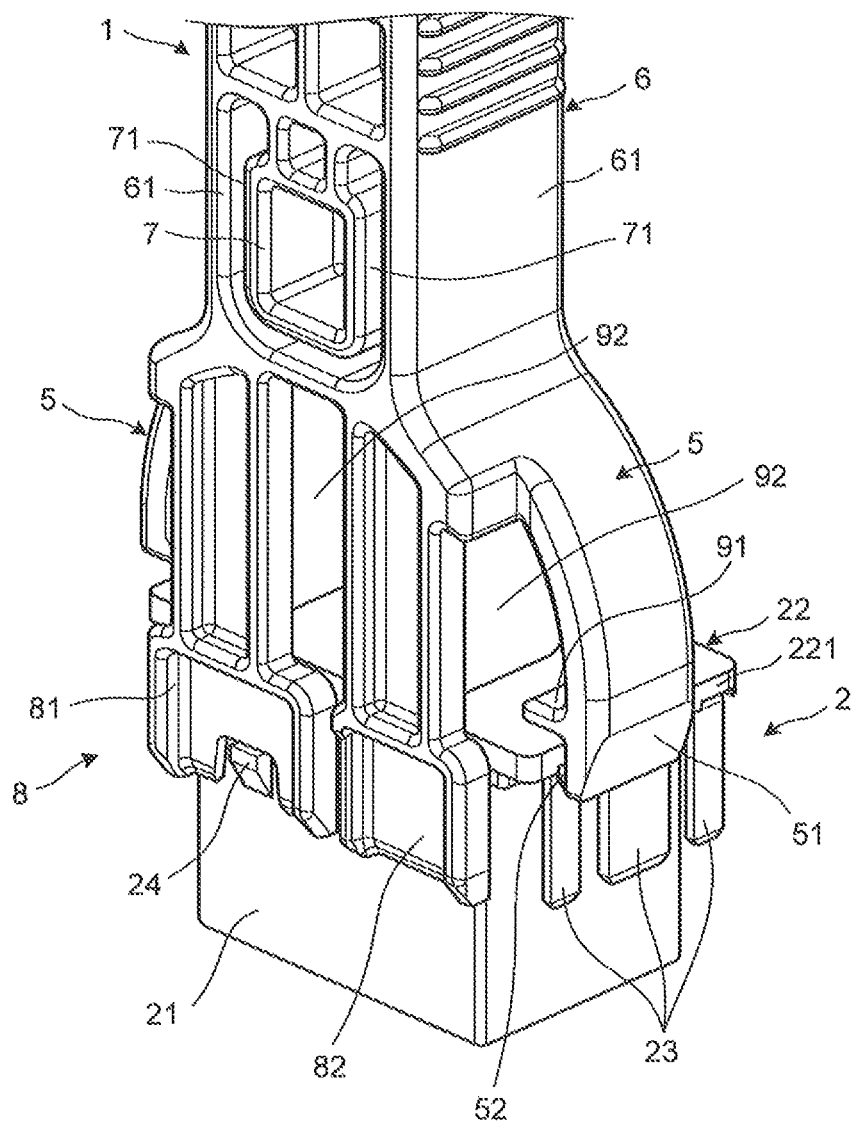
FIG. 8 is a perspective view illustrating only the relay detachment jig and the relay illustrated in FIG. 7.
Figure 9:
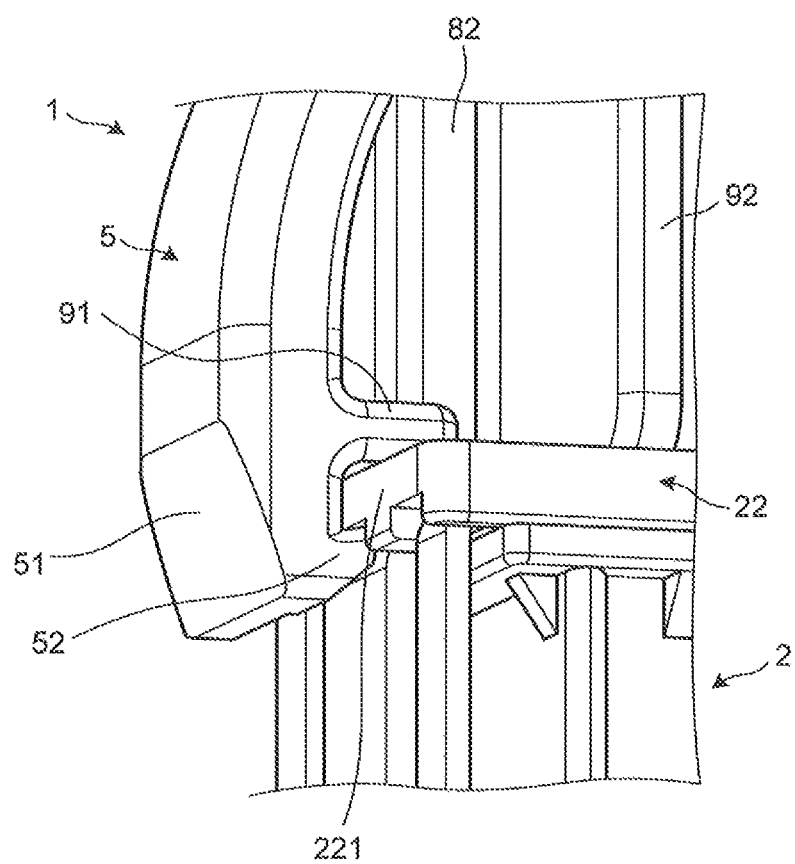
FIG. 9 is an enlarged perspective view of relative portions of FIG. 8.

As the relay 2 becomes held in the relay detachment jig 1, the engagement between the relay 2 and the housing member 3 is released, as illustrated in FIGS. 7 and 8. When the relay detachment jig 1 is pressed against the top surface of the plate-like member 22, the aligning piece 82 becomes inserted into a space between the engaging piece 33*b* and the relay 2, guiding the position where the relay detachment jig 1 is inserted, and causes the engagement releasing piece 81 to be inserted between the engaging protrusion 24 on the relay 2 and the engaging piece 33*a*. This causes the engaging piece 33*a* to deform toward the relay housing 3*b* in the direction indicated by the arrow A in FIG. 5, and causes the engagement between the engaging protrusion 24 and the engaging piece 33*a* to release. Finally, the operator can detach the relay 2 from the relay housing 3*a* by making a pulling-out operation of pulling out the relay detachment jig 1 in the detaching direction Y, by holding the handle 4. During the pulling-out operation, the relay 2 may receive a force causing the relay 2 to become separated from the protrusions 52 and to move in the detaching direction Y. Such a movement in the detaching direction Y is however restricted by the first movement restricting unit 91 and the second movement restricting unit 92 abutting against the plate-like member 22, and therefore, the relay 2 is kept held by the relay detachment jig 1 without being released easily.

A way in which the relay 2 held in the relay detachment jig 1 is detached will now be explained. When an operator pushes the hold releasing unit main bodies 61 of the hold releasing unit 6 with a hand, for example, to cause the hold releasing unit main bodies 61 to bend and deform in the width direction X and in the direction approaching each other, the pair of holders 5 become bent and deformed in a direction in which the ends 51 of the pair of holders 5 move away from each other, and the protrusions 52 are move away from the plate-like member 22 of the relay 2. In this manner, the force holding the relay 2 is released, so that the operator can detach the relay 2 from the relay detachment jig 1.

With the embodiment described above, because the pair of holders 5 is enabled to bend and deform in the direction moving away from each other when the protrusions 52 provided to the respective ends 51 of the pair of holders 5 are pressed against the top surface of the plate-like member 22 in the relay 2, an operator can hold the relay 2 with the relay detachment jig 1 by making the pressing operation. Furthermore, the operator can detach the relay 2 from the housing member 3 while the relay 2 is kept held in the relay detachment jig 1 by making the pulling-out operation. Therefore, the operator can detach the relay 2 housed in the housing member 3 simply by making the pressing operation and the pulling-out operation. Furthermore, because the pair of holders 5 is enabled to bend and deform in the direction moving away from each other when the hold releasing unit main bodies 61 are deformed in the direction approaching each other, the operator can release the relay 2 held in the relay detachment jig 1 by making a simple operation such as an operation of pressing the hold releasing unit main bodies 61. Furthermore, the operation of detaching the housing member 3 from the relay 2 and the operation of removing the relay 2 from the relay detachment jig 1 can be performed solely with one hand.

Furthermore, because the deformation restricting unit 7 has the restricting sides 71 against which the respective hold releasing unit main bodies 61 can abut, the deformation restricting unit 7 can prevent an excessive deformation and plastic deformation of the hold releasing unit main bodies 61, and can restrict the deformation of the hold releasing unit main bodies 61 so that the hold releasing unit main bodies 61 deform within a range of their elasticity.

Furthermore, because the relay detachment jig 1 is provided with the engagement releasing unit 8 that releases the engagement between the relay 2 and the housing member 3, the operator can detach the relay 2 from the housing member 3 while releasing the engagement between the relay 2 and the housing member 3. The workability is therefore improved further.

Furthermore, because the relay detachment jig 1 is provided with the first movement restricting unit 91 and the second movement restricting unit 92 that are positioned above the plate-like member 22 and that restrict the movement of the relay 2 in the detaching direction Y while the relay 2 is held in the relay detachment jig 1, the operator can allow the relay detachment jig 1 to hold the relay 2 more securely, the workability in detaching the relay 2 can be improved.

Furthermore, because the handle 4 is thinner (smaller) than the outer size of the pair of holders 5 in the width direction X, the operator can hold the handle 4 at a position nearer to the internal of the relay detachment jig 1 than the outer size of the pair of holders 5, that is, than the outer size of the relay 2, the operator can detach the relay 2 with the relay detachment jig 1 even when the relay 2 is housed in a narrow space.

The present invention is, however, not limited to the embodiment described above, and modifications described below also fall within the scope of the present invention, as well as other configurations enabled to achieve the object of the present invention.

For example, in the embodiment described above, the relay detachment jig 1 is explained to be used as a jig for detaching the relay 2, but the relay detachment jig 1 may be used as a jig for detaching any component other than the relay 2, as long as the relay detachment jig 1 is capable of holding the component. Furthermore, the relay 2 is not necessarily need to be engaged with the housing member 3.

Furthermore, in the embodiment described above, the hold releasing unit 6 is explained to be provided with two (a pair of) bendable and deformable hold releasing unit main bodies 61, but the hold releasing unit according to the present invention may be configured in any way, as long as the pair of holders 5 are elastically deformed in the direction causing the ends 51 to move away from each other and to release the hold of the relay 2. The hold releasing unit may be, for example, implemented using a spring or some elastic material.

Furthermore, the deformation restricting unit 7 may have any shape, as well as the rectangular shape, that is enabled to restrict the width to which the hold releasing unit main bodies 61 become deformed within a range of their elasticity so that the plastic deformation resultant of an excessive deformation of the hold releasing unit main bodies 61 is prevented.

Furthermore, in the embodiment described above, the relay detachment jig 1 is explained to be provided with the first movement restricting unit 91 and the second movement restricting unit 92 for restricting the movement of the relay 2 held in the relay detachment jig 1 in the detaching direction Y, but the relay detachment jig 1 may be provided with at least one of the first movement restricting unit 91 and the second movement restricting unit 92, as long as such a movement restricting unit can restrict the movement of the relay 2 in the detaching direction Y.

Furthermore, the length of the handle 4 may be determined based on the position where the relay 2 is attached. For example, when the housing member 3 is installed in a deep and narrow space, the length of the handle 4 may be extended so that the operator can detach the relay 2 housed in the space where the operator cannot reach with a hand.

According to the present invention, one end of each of a pair of holders is provided with a protrusion for supporting the component, and the pair of holders is enabled to bend and deform in a direction moving away from each other when the protrusions are pressed from the side opposite to the handle. Therefore, when an operator holding the handle performs a pressing operation of pressing the component detachment jig against the component, the protrusions become pressed against the component, and the pair of holders becomes deformed and becomes separated by a distance wider than the length between the two edges of the component. This widening of the holders removes the pressing force against the protrusions, and the pair of holders is brought back to the original position where no force is applied, while the component is held supported by the protrusions from the opposite direction of the detaching direction. Furthermore, the operator can detach the component held in the component detachment jig by making a pulling-out operation of moving the component detachment jig in the detaching direction that is the opposite direction of the pressing direction, by holding the handle. Therefore, the operator can detach the component housed in a housing simply by making the pressing operation and the pulling-out operation to the component, without changing the way in which the operator holds the handle between when the operator makes the pressing operation and when the operator makes the pulling-out operation, for example. Furthermore, because the pair of holders are enabled to bend and deform in the direction moving away from each other when the hold releasing unit is elastically deformed in the direction intersecting with the detaching direction, the operator can release the holding of the component and detach the component from the component detachment jig easily by pressing the hold releasing unit with a hand and causing the hold releasing unit to elastically deform, without widening the pair of holders in the direction moving away from each other with both hands, for example, when the operator is to detach the component from the component detachment jig. Furthermore, the operator can perform both of the operation of detaching the component from the housing and the operation of detaching the component from the component detachment jig merely with one hand. Therefore, a component detachment jig with better workability can be provided.

While the best configurations and methods for implementing the present invention are described above, the present invention is not limited thereto. In other words, while a specific embodiment of the present invention is mainly illustrated in the drawings and explained above, those skilled in the art should be able to make various modifications to the shape, the material, the quantities, and other details described in the embodiment, within the scope not deviating from the technical idea and the object of the present invention.

Therefore, any descriptions limiting the shape, the material, and the like are provided as an example for facilitating the understanding of the present invention, and are not intended to limit the scope of the present invention in any way. Therefore, descriptions using the names of respective members with some or the entire limitations such as the shape or the material removed still fall within the scope of the present invention.

What is claimed is:

1. A component detachment jig for removing a component from a housing to which the component is attached, the component detachment jig comprising:
 a handle;
 a pair of holders configured to hold the component; and
 a hold releasing unit configured as a set of plates and configured to connect the handle and the pair of holders, and the set of plates are configured to be elastically deformable towards each other in a direction intersecting with a detaching direction in which the component is detached, wherein
 the handle is provided in a manner extending in the detaching direction from the hold releasing unit, each holder in the pair of holders has a cantilever-arm like shape which is bendable and deformable, and has one end which is not connected to the hold releasing unit provided with a protrusion protruding in a direction toward a protrusion on the other holder, and supporting the component in a direction opposite to the detaching direction, the pair of holders and the protrusions are enabled to bend and deform in a direction moving away from each other when the set of plates are elastically deformed towards each other, and when the protrusions are pressed from a side opposite to the handle in the detaching direction, the hold-releasing unit has a width smaller than an external size of the pair of holders in a direction in which the pair of holders face each other, the handle has a width smaller than the external size of the pair of holders in the direction in which the pair of holders face each other, and an outer surface of the hold-releasing unit is integral with and planar with at least portions of an outer surface of the handle.

2. The component detachment jig according to claim 1, further comprising: a deformation restricting unit configured to restrict elastic deformation of the hold releasing unit, wherein the deformation restricting unit includes a pair of restricting sides.

3. The component detachment jig according to claim 2, wherein the set of plates is configured as two bendable and deformable plates, and the two bendable and deformable plates are enabled to abut against the pair of restricting sides of the deformation restricting unit.

4. The component detachment jig according to claim 3, wherein the component is a component having an engaging unit which is to be engaged with the housing, and the component detachment jig further comprising:

an engagement releasing unit configured to release an engagement between the housing and the component engaged with the housing, wherein the engagement releasing unit includes a releasing piece and an aligning piece provided side by side along a width direction.

5. The component detachment jig according to claim 3, further comprising:

a movement restricting unit configured to restrict a movement of the component supported by the protrusions in the detaching direction, wherein the movement restricting unit includes a first pair of restricting units that extend inwardly in a width direction, and a second pair of restricting units that extend downwardly from the pair of holders in a length direction.

6. The component detachment jig according to claim 2, wherein the component is a component having an engaging unit which is to be engaged with the housing, and the component detachment jig further comprising:

an engagement releasing unit configured to release an engagement between the housing and the component engaged with the housing, wherein the engagement releasing unit includes a releasing piece and an aligning piece provided side by side along a width direction.

7. The component detachment jig according to claim 2, further comprising:

a movement restricting unit configured to restrict a movement of the component supported by the protrusions in the detaching direction, wherein the movement restricting unit includes a first pair of restricting units that extend inwardly in a width direction, and a second pair of restricting units that extend downwardly from the pair of holders in a length direction.

8. The component detachment jig according to claim 1, wherein the component is a component having an engaging unit which is to be engaged with the housing, and the component detachment jig further comprising:

an engagement releasing unit configured to release an engagement between the housing and the component engaged with the housing, wherein the engagement releasing unit includes a releasing piece and an aligning piece provided side by side along a width direction.

9. The component detachment jig according to claim 8, further comprising:

a movement restricting unit configured to restrict a movement of the component supported by the protrusions in the detaching direction, wherein the movement restricting unit includes a first pair of restricting units that extend inwardly in a width direction, and a second pair of restricting units that extend downwardly from the pair of holders in a length direction.

10. The component detachment jig according to claim 1, further comprising:

a movement restricting unit configured to restrict a movement of the component supported by the protrusions in the detaching direction, wherein the movement restricting unit includes a first pair of restricting units that extend inwardly in a width direction, and a second pair of restricting units that extend downwardly from the pair of holders in a length direction.

* * * * *